United States Patent
Chen

(10) Patent No.: US 8,644,359 B1
(45) Date of Patent: Feb. 4, 2014

(54) HIGH POWER QUANTUM DOT OPTICAL LIGHT SOURCE

(71) Applicant: Verizon Patent and Licensing Inc., Arlington, VA (US)

(72) Inventor: David Zhi Chen, Richardson, TX (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 0 days.

(21) Appl. No.: 13/657,117

(22) Filed: Oct. 22, 2012

(51) Int. Cl.
*H01S 5/00* (2006.01)

(52) U.S. Cl.
USPC .............. 372/50.23; 372/50.12; 372/50.1; 372/97; 372/92

(58) Field of Classification Search
USPC ............ 372/50.23, 50.12, 50.1, 97, 92
See application file for complete search history.

(56) References Cited

U.S. PATENT DOCUMENTS

| | | | |
|---|---|---|---|
| 2003/0169787 A1* | 9/2003 | Vurgaftman et al. | 372/20 |
| 2011/0176328 A1* | 7/2011 | Anandan et al. | 362/606 |
| 2011/0255303 A1* | 10/2011 | Nichol et al. | 362/606 |
| 2011/0310220 A1* | 12/2011 | McEldowney | 348/42 |

* cited by examiner

*Primary Examiner* — Kinam Park

(57) ABSTRACT

A system comprising a multiplicity of quantum dot lasers disposed on a back surface of a control circuit, wherein each of the quantum dot lasers produces coherent light; a multiplicity of micro-lens collimators, each micro-lens collimator secured to a corresponding quantum dot laser, where light generated by the quantum dot laser passes through the fiber and exits at the tip; a diffraction grating, wherein the light from each of the micro-lens collimators is directed to the diffraction grating; and wherein the coherent light leaving the diffraction grating is a high powered optical light.

25 Claims, 3 Drawing Sheets

HIGH POWER QUANTUM DOT OPTICAL LIGHT SOURCE

BACKGROUND

Quantum dot (nano-scale) lasers are lasers embedded in quantum dot cavities. The lasers emit coherent light within a narrow range of wavelengths. The power and noise level of a given quantum dot laser depends, in part, on the size of the quantum dot cavity which generates the laser. Quantum dot cavities typically differ at least slightly in size from one another. Due to the tiny sizes of the quantum dot laser, it is difficult to make them uniform in size. This means that power and noise levels may not be uniform among quantum dot lasers.

Because of the nature of quantum dot lasers, individually they generally have lower noise levels than traditional lasers, but they also have lower power. The noise level of light emitted from quantum dot lasers generally is directly related to the size of the quantum dot cavity which, in turn, is generally related to the power of the quantum dot laser. Thus, a larger quantum dot cavity will produce a laser emitting coherent light with higher power than a smaller quantum cavity, but the more powerful laser will also have a higher noise level. Additionally, since it may be difficult to control the size of the quantum dot cavities, a wider range of wavelengths than desired may result, which also increases the accompanying overall noise levels. The trade-off between power and noise levels in quantum dot lasers limits the uses to which the lasers can be put, as many applications requiring low noise levels also require high power.

DETAILED DESCRIPTION

Figure 1:
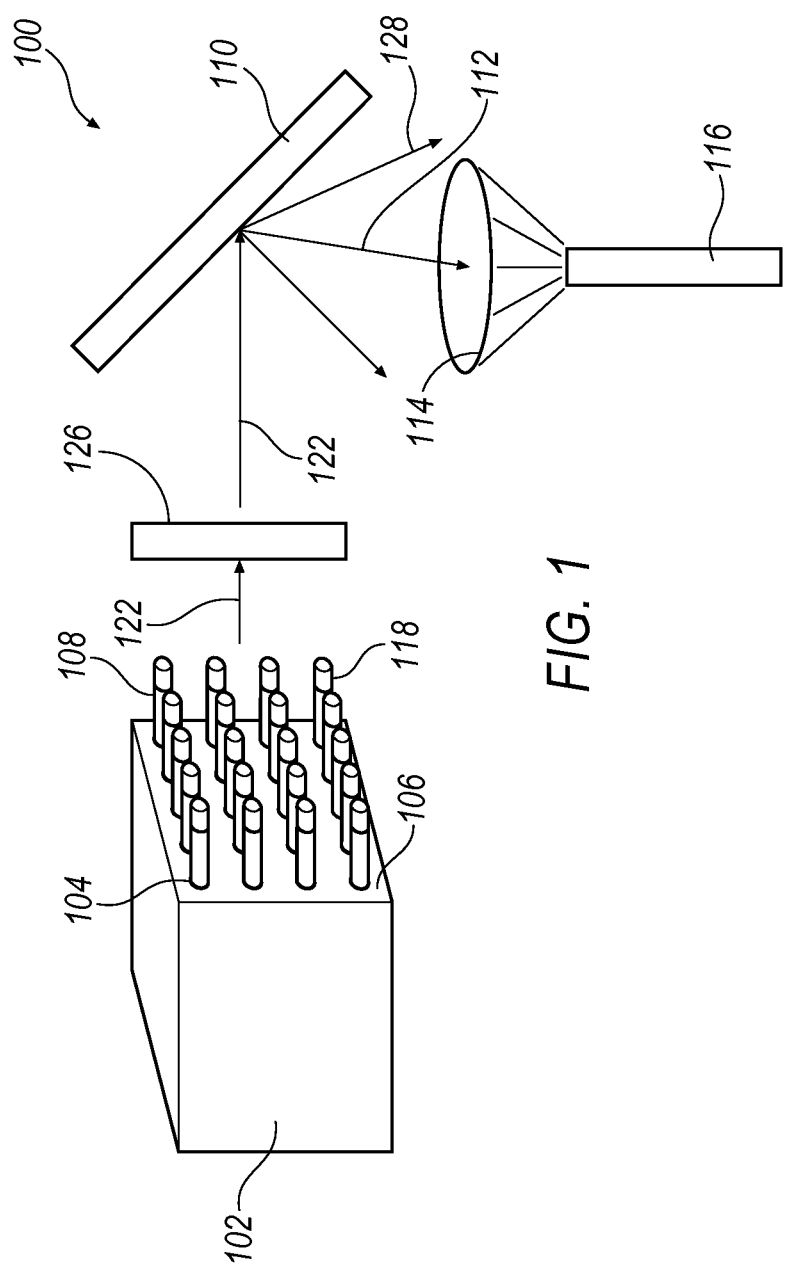
FIG. 1 illustrates an exemplary system for a high power quantum dot optical light source.

Referring now to the discussion that follows and also to the drawings, illustrative approaches to the disclosed apparatuses and methods are shown in detail. Although the drawings represent some possible approaches, the drawings are not necessarily to scale and certain features may be exaggerated, removed, or partially sectioned to better illustrate and explain the disclosed device. Further, the descriptions set forth herein are not intended to be exhaustive or otherwise limit or restrict the claims to the precise forms and configurations shown in the drawings and disclosed in the following detailed description.

An exemplary system for generating a high powered coherent beam of light combines a multiplicity of quantum dot lasers, micro-lens collimators secured to the quantum dot lasers, and a diffraction grating to reduce the noise in the system. A first collimator may be disposed between the quantum dot lasers and diffraction grating. It may also include a lens to collect the light beams from the quantum dot lasers, and focus them on a focal point on the diffraction grating. Since the system makes use of multiple quantum dot lasers with their characteristic small cavities and low noise levels, the system has lower initial noise levels than other types of lasers, then reduces the noise even further for very low noise levels. The system also takes advantage of the principle that, in certain circumstances, the powers of a multiplicity of lasers can be additive. This may result in a high powered light source with very low noise levels.

FIG. 1 illustrates an exemplary system for a high powered, low noise laser generated from a multiplicity of quantum dot (nano-scale) lasers. In an exemplary configuration, the high powered laser 100 contains a control circuit 102 with a multiplicity of quantum dot cavities 120 disposed on a back surface 106 of the control circuit 102. A micro-lens collimator 108 may be disposed on each of the emitting surfaces of the quantum dots, and the micro-lens collimators 108 may be optical fibers. A diffraction grating 110 may be disposed between the control circuit 102 and a lens 114. A collector 116 may be disposed after the lens 114 and at the focal point of lens 114. As discussed in more detail below, a second collimator 126 may be disposed between the plurality of optical fibers 108 and diffraction grating 110.

Figure 2:
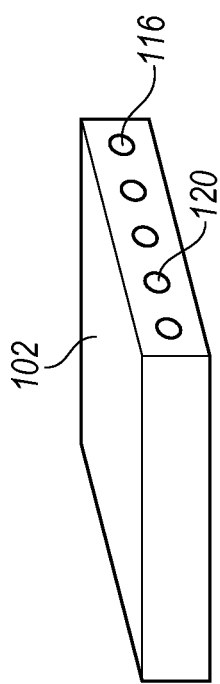
FIG. 2 illustrates a quantum dot cavity chip containing a row of quantum dot cavities arrayed on a control circuit with the control circuit disposed behind the quantum dot cavities.
Figure 3:
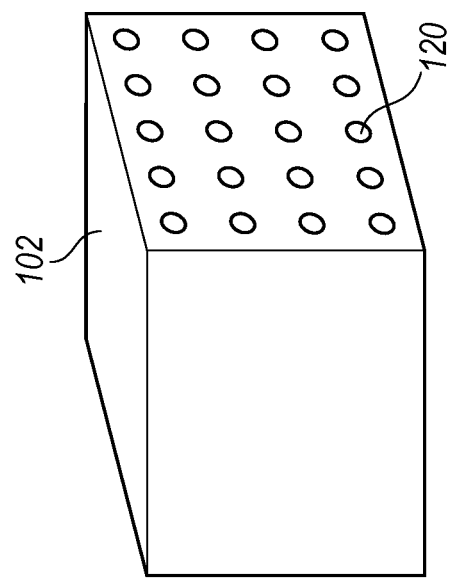
FIG. 3 illustrates rows and columns of quantum dots lined up together in such a way that the quantum dot cavities form a matrix on a planar surface with the control circuit disposed behind the quantum dot matrix.

The system for a high powered laser 100 uses quantum dot lasers because light coming from the quantum dot lasers is more pure, or has a tighter range of wavelengths (has much better coherence), than light from other laser sources. It is easier to control the purity of the light at the source rather than to try to control it by other means. The quantum dot lasers 104 are generated from quantum dot cavities 120 that may be disposed on a control circuit 102. A planar surface 106 may be disposed on the rear side of a control circuit 102. Multiple layers, each having a multiplicity of quantum dot cavities 120 on it, may be disposed on surface 106 one layer at a time, as illustrated in FIG. 2. This may result in the formation of a matrix, with multiple rows and multiple columns of quantum dot cavities, as illustrated in FIG. 3. The quantum dot cavities 120 may also be disposed in a honeycomb configuration (not shown) or any other suitable regular arrangement. The regular arrangement of the quantum dot lasers allows more quantum dot lasers to be disposed in a smaller space than would be otherwise. While the power of each of the lasers 104 emitted by the quantum dot cavities 120 is minute, using a multiplicity of quantum dot lasers 104 and combining them may produce a powerful laser, and distributing more lasers in a smaller space allows the generation of a more powerful laser.

Although the light source coming from the quantum dot lasers is more pure than traditional lasers, there is still a small amount of variation in the wavelengths of the light emitted from the quantum dots. Each quantum dot laser emits a range of light wavelengths based, in part, on the size of the quantum dot cavity. Even within each quantum dot cavity, a small range of different wavelengths of light may be emitted; more variation in wavelengths from larger quantum dot cavities, and less in smaller quantum dot cavities. Since it is difficult to control the size of quantum dot cavities with the desired level of precision, the quantum dot cavities may all be slightly different in size and, therefore, each may emit a slightly different range of wavelengths of light.

The light emitted by each quantum dot laser may contain a small range of different wavelengths, including a desired wavelength of light, and some undesired wavelengths. Focusing and collimating the light from the regular arrangement of quantum dot lasers to a diffraction grating may enable the separation of the different wavelengths. The desired wavelengths leaving the diffraction grating may then be focused and collimated. This may result in a more powerful laser, and may substantially reduce noise levels due to undesired wavelengths. Using a diffraction grating 110 on the focused and collimated light may disperse the light with unwanted wavelengths, and send the light with desired wavelengths may be sent to a collector, thus resulting in a powerful and pure coherent light.

Although quantum dot lasers can produce light in a range of wavelengths depending on the cavity design, material, and size, the wavelength chosen for the high powered laser 100 may be capable of being carried in both single mode or multi-mode optical fibers. Using a single mode optical fiber sets a minimum fiber cut-off wavelength of approximately 1260 nm. Light with wavelengths of approximately 1540 nm to 1557 nm will experience much lower losses in single mode fiber optic cable than light with other wavelengths. In addition, light of that wavelength is commonly used in the communications industry. Wavelengths beyond the traditional communication range still can be produced by the quantum dot lasers, and the final high powered quantum dot optical light source can be collected and used in many other applications, including industrial and military applications.

Figure 4:
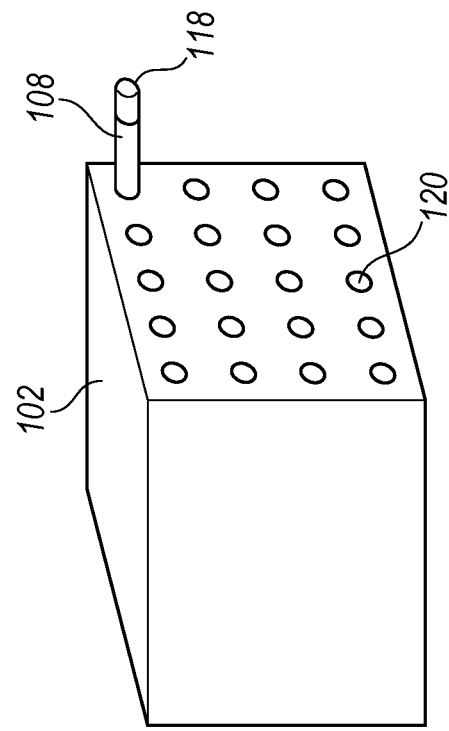
FIG. 4 illustrates a micro-lens collimator attached to a quantum dot cavity in the matrix of FIG. 3.

As illustrated in FIG. 4, micro-lens collimators 108 may be attached to each of the quantum dot lasers 104, and may extend perpendicularly from surface 106, and parallel to one another. One type of micro-lens collimators that may be used is optical fibers. One end of each of the micro-lens collimators 108 may be attached to the quantum dot lasers 104 either mechanically or with epoxy, or by any other suitable means. If optical fibers are attached to each quantum dot laser 104, they may be single mode optical fiber, which allows only a single ray (mode) of light to pass through the fiber. Single-mode optical fiber reduces the range of wavelength modes that can pass through the fibers. Typically, single mode optical fibers have core diameters ranging between 8 and 10.5 microns, with the smaller core diameters more severely restricting the range of wavelength modes that may enter the fiber. Single mode fibers with a core diameter of eight microns will limit the wavelength modes more than larger diameters. Single mode fibers that comply with the G.652.D specification and thus have low attenuation in the C band, may be used as the single mode optical fiber, as it is a commonly available fiber, and is suitable for a variety of uses. Alternatively, single mode fibers with cores smaller than eight microns will better match the size of the quantum dot lasers and may be used, but they may need to be custom made. For financial reasons, multimode fibers with core sizes of approximately 50 microns and graded index profiles may be more desirable, and are easy to align in relation to the quantum dot laser emitting surface.

Single mode fibers work well to transmit the light from the quantum dot lasers. Designed for light propagation rather than for focusing or dispersing light beams, the single mode optical fibers act as wave guides for the light travelling through them. However, under normal conditions, once light leaves the single mode optical fiber, the fiber no longer guides the light, and the light diverges. In order to preserve the wave guide characteristics of the single mode optical fiber 108 and avoid having light beams diverge, the tips 118 of the single mode optical fibers 108 may be modified to make them a transition region that functions like a small lens, to collimate the light coming out. That is done by configuring the index profile of the tip 118 of the fiber 108 so it is a graded index profile and acts as a lens. Multimode fiber 108 may also be used as the micro-lens collimator as, since the wave propagation distance will be very short, optical mode dispersion for multimode will not be an issue.

Typically, single mode optical fibers have a uniform refractive index within the core of the fiber and a sharp decrease in the refractive index at the interface between the core and the cladding of the fiber. However, a graded index profile may be suitable for the fibers 108 attached to the quantum dot lasers 104. In a fiber with a graded index profile, the core of the fiber has a refractive index that decreases as the distance from the axis of the fiber increases. Treating the tips 118 of fibers 108 to modify the fiber index profile at the fiber tip may cause the tips 118 to function like lenses. In a fiber with a graded index profile at the tip 118, light will travel from quantum dot laser 104 through fibers 108 and through a short piece of transition fiber at the tip 118 (a so-called micro-lens) of fiber 108 before leaving fiber 108. In the transition region at the tip 118 of fiber 108, the fiber no longer acts as a wave guide, but rather, directs the light so that the light leaving the fibers 104 at the transition regions at the fiber tips 118 is collimated. Once emitted from the fiber tip 118, the light may be focused, aligned, and parallel to one another.

The focused, aligned, and collimated light 122 emitted from the micro-lens collimators 108 may be directed to a collimator 126 which, in turn, may re-direct and focus the light to a diffraction grating. Collimator 126 may have an anti-reflective coating to facilitate the collecting of light beams 122. The collimator may be desirable because, although the light leaving the micro-lens collimators 108 is collimated, each beam is directed in a direction roughly axially congruent with the micro-lens collimator 108 from which it is emitted. This may lead to widely scattered beams 122 leaving the fiber tips 118, as the beams 122 may be dispersed in an arrangement having substantially the same dimensions as the distribution of quantum dot lasers 104 on planar surface 106. A collimator 126 placed after the micro-lens collimators 108 may collect the two-dimensional distribution of light and focus it onto diffraction grating 110. The orientation or position of collimator 126 may be adjustable to facilitate the maximum collection of light beams 122. A lens (not shown) may be disposed on collimator 126 to facilitate collecting as much of the light as possible. Collimating and converging the light 122 from the quantum dot lasers 104 may make it possible to use a smaller diffraction grating 110 than would otherwise be required, as the cross-sectional area of the light beams 122 being sent to the diffraction grating 110 would be smaller than if the light were not collimated.

Upon leaving collimator 126, light beams 122 may be directed to a diffraction grating 110. Alternatively, the light beams 122 may be directed directly to diffraction grating 110 from the micro-lens collimators 108 rather than first being directed to collimator 126. If light 122 is directed directly to diffraction grating 110, the diffraction grating will need to be larger than it would be if light 122 were first directed to collimator 126.

Diffraction gratings have a multiplicity of grooves that result in high precision in light-separating properties. Diffraction gratings with smaller cross-sectional areas may be more accurate and of higher quality than those with larger areas, as smaller diffraction gratings may be more precisely carved than a larger one, and will thus have more control over the separation of the wavelengths. As the desired specificity of the range of wavelengths leaving the diffraction grating 110 is very small, an accurate diffraction grating 110 is desired. By first collimating and collapsing the light beams 122 into a small dot, a smaller diffraction grating 110 may be used.

The orientation or position of diffraction grating 110 may be adjustable to facilitate the maximum scatter of light. Diffraction grating 110 diffracts and separates the light beams 122 in such a way that light beams with different wavelengths are directed in different directions, and light of the desired wavelength 112 may be collected. This artificial separation of light 122 by diffraction grating 110 and the resulting narrow range of wavelengths 112 may result in a light beam with low noise levels, as the noise-inducing undesired wavelengths are not collected. Light leaving the diffraction grating 110 may also be of very high power, since a large number of light beams with very similar wavelengths have been produced and collimated.

A collecting system comprising a lens 114 and a collector 116 may be used to collect the light. The orientation or position of collector 116 may be adjustable to facilitate the maximum collection of light. Since the collimated light 112 leaving diffraction grating 110 is of high power but slightly diverged, lens 114 may be used to handle the power level emitted by slightly diverged light 112. Light 112 with the desired wavelength may be directed by diffraction grating 110 to lens 114 to be collected, while light beams 128 with unwanted wavelengths may be dispersed at an angle that will not allow those beams 128 to be collected on lens 114. The orientation or position of lens 114 may be adjustable to facilitate collection of light beams 112.

The surface of lens 114 may be coated with a suitable material, such as a highly anti-reflective coating, to facilitate the efficient collection of desired light beams 112 that have been directed to it by diffraction grating 110. Once lens 114 has collected the desired light wavelengths 112 that have been directed from diffraction grating 110, it may focus them on a focal point of a collector 116. Collector 116 may be a collimator. Collector 116 aligns the light 112. This may result in a high-powered optical light source with low noise levels. The resulting high-powered optical light source with low noise levels may be used as the source of an optic amplifier, an optic laser, or in other applications. If higher powered optical light sources are desired, a multiplicity of systems 100 may be combined. A similar method may be used to add them in a parallel format.

As the light beams travel through system 100, there are several places where the noise of the lasers may be reduced. Although quantum dot lasers 104 have inherently low noise, they do have some noise, which it may be desirable to further reduce. Using many quantum dot lasers 104, each with low noise, enables the system to have a low initial noise level. The divergence of the light beams 122 from the quantum dot lasers 104 means that the resulting combined laser is not sufficiently powerful, and will still have some noise. Collimating the light 122 from the quantum dot lasers 104 and focusing it onto a single point will make it more powerful, but will not reduce the noise inherent in the system to this point. However, the diffraction grating 110, by diverting the light beams 128 with undesired wavelengths, does remove much of the noise in the system. The light 112 collected after leaving the diffraction grating 110 does have high power and low noise. Directing it to a lens followed by a further collimator may convert the light to a form in which it can be more easily used.

Figure 5:
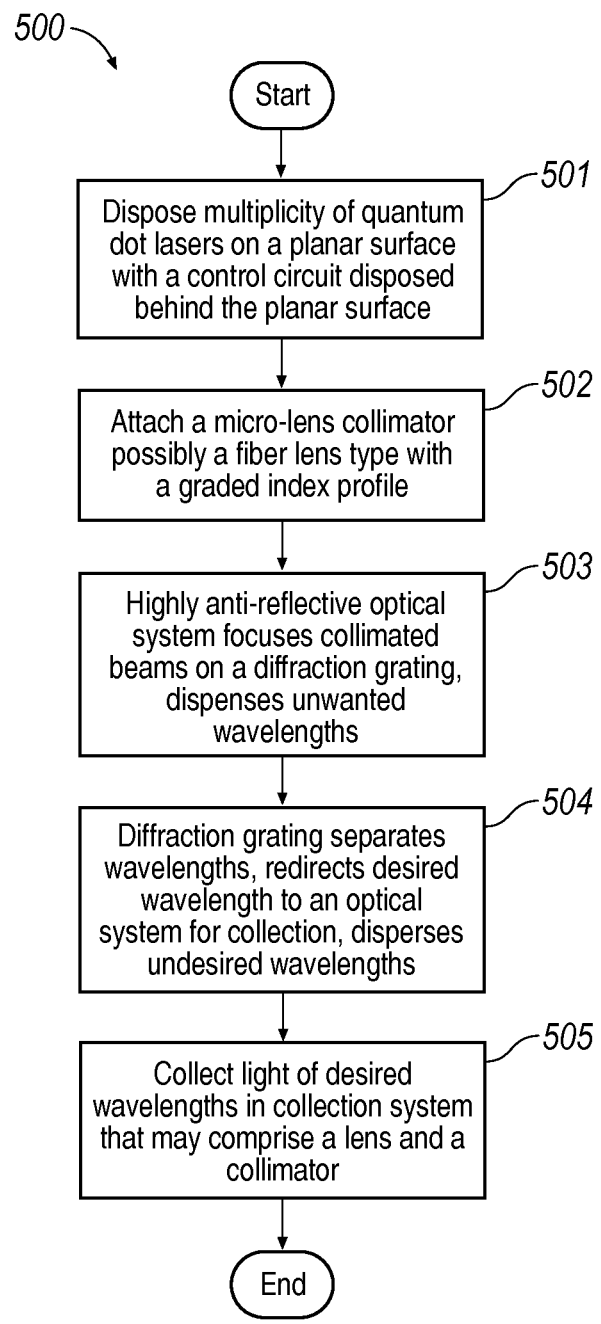
FIG. 5 illustrates an exemplary method for a high power quantum dot optical light source.

FIG. 5 is a flowchart illustrating an exemplary high power quantum dot optical light source using quantum dot lasers and a diffraction grating 500. The flowchart starts in block 501, wherein a multiplicity of quantum dot lasers is disposed on a planar surface, where a control circuit is disposed behind the planar surface. The quantum dot lasers may be disposed in a matrix, or in any other orderly arrangement. Next, in block 502, an optical fiber or other micro lens collimator may be attached to each of the quantum dot lasers. If optical fibers are used, they may be single mode optical fibers, and each of the optical fibers may have a graded index profile to enable the fibers to collimate the light emitted from the optical fibers. Alternatively, multimode optical fibers may be used. The optical fibers may be attached parallel to one another and perpendicular to the planar surface containing the quantum dot lasers which is disposed on the back of control circuit. In block 503, a highly anti-reflective optical system focuses collimated beams on a diffraction grating. The light may first be directed to an optional first collimator. In box 504, the diffraction grating separates the wavelengths, redirecting desired wavelengths to an optical system for collection, while dispersing light beams with wavelengths that are not desired. Finally, in block 505, the desired wavelengths of light from the diffraction grating may be directed to a collection system which may contain a lens and a second collimator to further collect and focus the light.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A system comprising:

a multiplicity of quantum dot lasers disposed on a back surface of a control circuit, wherein each of the quantum dot lasers produces coherent light;

a multiplicity of micro-lens collimators, each micro-lens having a first end and a second end the first end of each micro-lens collimator secured to a corresponding quantum dot laser; and a diffraction grating;

wherein light generated by the quantum dot lasers passes through the multiplicity of micro-lens collimators and is collimated when it exits at the second end of the micro-lens collimators;

wherein the light from the second end of each of the micro-lens collimators is directed to the diffraction grating; and wherein the coherent light leaving the diffraction grating is a high powered optical light.

2. The system of claim 1 further comprising a collecting system wherein the diffraction grating deflects light of a desired wavelength to the collecting system.

3. The system of claim 1 wherein the quantum dot lasers are disposed on a planar surface so they form a regular arrangement of quantum dot lasers, and wherein the planar surface is disposed on the back surface of the control circuit.

4. The system of claim 1 wherein the micro-lens collimator is a single mode optical fiber, wherein a fiber index profile of the fiber is a graded index profile to form a transition region at a free end tip of the fiber such that light generated by the quantum dot laser passes through the fiber and is collimated when it exits at the tip.

5. The system of claim 4 wherein the single mode optical fiber has a core diameter of no more than eight microns.

6. The system of claim 3 wherein each micro-lens collimator extends perpendicularly away from the planar face of the control circuit and essentially parallel one to another so the light from the quantum dot lasers is aligned.

7. The system of claim 1 wherein the micro-lens collimators are attached to the quantum dot lasers by one of mechanically or with epoxy.

8. The system of claim 1 wherein the micro-lens collimator is a multimode optical fiber.

9. The system of claim 4 wherein the tip of each optical fiber acts as a collimator for the light.

10. The system of claim 2 wherein the collecting system comprises a lens and a downstream collimator, the light selectively passing through the lens to filter it into a desired range of wavelengths, focusing it, and passing the filtered light into the downstream collimator.

11. The system of claim 4 wherein a collimator is disposed between a multiplicity of optical fibers and the diffraction grating, and wherein the collimator directs the light from the second ends of the micro-lens collimators to the diffraction grating.

12. A system comprising:
a multiplicity of quantum dot lasers disposed on a back surface of a control circuit wherein each of the quantum dot lasers produces coherent light;
a multiplicity of micro-lens collimators, each micro-lens collimator secured to a corresponding quantum dot laser;
a first collimator, wherein the each the micro-lens collimator is directed to the first collimator; and
a diffraction grating, wherein the light from the first collimator is directed to the diffraction grating; and
wherein the coherent light leaving the diffraction grating is a high powered optical light.

13. The system of claim 12 further comprising a collecting system comprising a lens and a second collimator, wherein the light leaving the diffraction grating is directed to the lens, and wherein the light leaving the lens is directed to the second collimator.

14. The system of claim 12 further comprising a lens disposed on the first collimator to facilitate a collection of the light.

15. The system of claim 12 wherein the micro-lens collimator is an optical fiber, and wherein the optical fiber is a single mode optical fiber.

16. The system of claim 12 wherein the quantum dot lasers are disposed on the back surface of the control circuit so they form a regular arrangement of quantum dot lasers on the back surface of the control circuit, wherein the back surface of the control circuit is planar, and wherein each micro-lens collimator extends perpendicularly away from the back surface of the control circuit.

17. A method comprising:
disposing a multiplicity of quantum dot lasers on a back surface of a control circuit;
attaching a micro-lens collimator to a multiplicity of the quantum dot lasers wherein a light generated by the quantum dot lasers passes through the micro-lens collimators and is collimated when it exits the micro-lens collimator;
directing the light emitted from the quantum dot lasers to a diffraction grating; and
dispersing unwanted wavelengths of light at the diffraction grating.

18. The method of claim 17 wherein the back surface of the control circuit is planar, and further comprising disposing the quantum dot lasers in a regular arrangement on the planar back surface of the control circuit.

19. The method of claim 18 further comprising extending the micro-lens collimators perpendicularly from the face of the control circuit and parallel to one another.

20. The method of claim 17 wherein the micro-lens collimators are single mode optical fibers.

21. The method of claim 17 further comprising securing each of the micro-lens collimators to a quantum dot laser.

22. The method of claim 21 further comprising securing each of the optical fibers to the quantum dot lasers with one of epoxy or mechanically.

23. The method of claim 17 further comprising a first collimator collimating the light from quantum dot lasers then directing the light to the diffraction grating.

24. The method of claim 17 further comprising providing a collecting system with a lens, wherein the diffraction grating diverts desired wavelengths of light to the lens of the collecting system.

25. The method of claim 24 further comprising providing a collimator for the collecting system, wherein the lens directs light to the collimator, and wherein the collimator collimates the light leaving the lens.

* * * * *